United States Patent
Schnabel et al.

(10) Patent No.: US 6,737,895 B2
(45) Date of Patent: May 18, 2004

(54) CONTROL SIGNAL GENERATING DEVICE FOR DRIVING A PLURALITY OF CIRCUIT UNITS

(75) Inventors: Joachim Schnabel, Berlin (DE); Bernd Klehn, Unterhaching (DE); Andrea Zuckerstätter, Munich (DE); Ralf Klein, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/196,566

(22) Filed: Jul. 16, 2002

(65) Prior Publication Data

US 2003/0030470 A1 Feb. 13, 2003

(30) Foreign Application Priority Data

Jul. 31, 2001 (DE) .......................... 101 37 373

(51) Int. Cl.[7] .............................. H03K 17/22
(52) U.S. Cl. ............... 327/143; 327/176; 327/198; 327/294
(58) Field of Search ................. 327/176, 192, 327/143, 291, 294, 298, 198

(56) References Cited

U.S. PATENT DOCUMENTS

| | | | |
|---|---|---|---|
| 4,794,453 A | 12/1988 | Gnuechtel et al. | 358/101 |
| 4,820,992 A | 4/1989 | Avis | 328/137 |
| 4,922,141 A | 5/1990 | Lofgren et al. | 307/595 |
| 5,177,375 A * | 1/1993 | Ogawa et al. | 327/143 |
| 5,408,139 A * | 4/1995 | Hayano | 327/143 |
| 5,463,336 A * | 10/1995 | Gupta et al. | 327/143 |
| 5,646,894 A * | 7/1997 | Lin et al. | 365/189.09 |
| 5,768,290 A | 6/1998 | Akamatsu | 371/22.4 |
| 5,770,959 A * | 6/1998 | Hopkins et al. | 327/143 |
| 6,060,942 A * | 5/2000 | Oh | 327/536 |
| 6,204,711 B1 | 3/2001 | Scarlett et al. | 327/291 |

* cited by examiner

Primary Examiner—Terry D. Cunningham
(74) Attorney, Agent, or Firm—Fish & Richardson, PC

(57) ABSTRACT

A method for driving a plurality of circuit units to be controlled includes applying a control signal to a control signal connection unit and an activation signal to an activation connection unit. A hold signal is the generated on the in response to the activation signal. This hold signal is combined with the control signal to obtain a modified control signal, which is then made available at an output.

24 Claims, 4 Drawing Sheets

CONTROL SIGNAL GENERATING DEVICE FOR DRIVING A PLURALITY OF CIRCUIT UNITS

RELATED APPLICATIONS

This application claims the benefit of the Jul. 31, 2001 priority date of German application 101 37 373.2.

FIELD OF INVENTION

The present invention generally relates to activation of circuit units to be controlled, and relates in particular to a method for driving circuit units to be controlled, in which a modified control signal is provided by means of a control signal generating device after activation via an activation unit.

BACKGROUND

In an integrated circuit (IC), a multiplicity of initialization procedures are provided after application of an external voltage. By way of example, all the internal voltages are typically generated in a generator unit and stabilized for further use in integrated circuit units to be controlled.

For operation, circuit units to be controlled, such as, for example, DRAM modules (DRAM=Dynamic Random Access Memory), require a control signal which permanently has a hold state, for example a logic one ("active high"). Only after a signal defined by the hold state is present at a control input of the circuit unit to be controlled does the circuit unit process externally provided commands. A corresponding control signal having a hold state is provided for example when all the voltage generators or generator units of an integrated circuit have signaled their functionality.

In the conventional method—illustrated in FIG. 4—for driving circuit units to be controlled a control signal 110 is fed via a connection unit 401 in parallel to a series of circuit units 202a–202n to be controlled.

In a disadvantageous manner, all the circuit units to be controlled are blocked if even just a single voltage generator of a generator unit has a malfunction, i.e. if the control signal 110 cannot be provided.

Thus, in an inexpedient manner, operation of the entire module or of the integrated circuit cannot be commenced. It is a further disadvantage that circuit units cannot be characterized in the event of a malfunction of a single voltage generator, even if they do not depend on the faulty voltage generator or the faulty circuit section in a generator unit.

Accordingly, it is extremely unfavorable that additional, cost-intensive production and characterization procedures are required for testing such modules provided with a fault in a single or a plurality of voltage generators of a generator unit.

SUMMARY

It is thus an object of the present invention to provide a method and a circuit arrangement in which, even in the case of one or more defective voltage generators of a generator unit, integrated switching units or modules can be tested and/or operated, at least one control signal being externally predeterminable or switchable.

An essential concept of the invention consists in combining a conventional control signal in a gate unit with a hold signal that can be set externally, in order to obtain a modified control signal in this way.

One advantage of the present invention is that circuit units which are not affected by a malfunction of a voltage generator of a generator unit or the like can be tested and/or operated independently of a control signal that has possibly not been supplied by the faulty voltage generator of a generator unit (if a malfunction has occurred in one or more voltage generators of a generator unit).

An additional, cost-intensive production and characterization process is advantageously obviated.

The invention's method for driving circuit units to be controlled essentially has the following steps:

a) application of a control signal to a control signal connection unit, the control signal being provided in a conventional manner by, for example, voltage generators of a generator unit;

b) application of an activation signal, provided by an activation unit, to an activation connection unit, the activation signal being externally predeterminable;

c) generation of a hold signal in a manner dependent on the activation signal, provided by the activation unit, by means of a switching device, the switching device being switchable either by means of a positive edge or a negative edge;

d) combination of the control signal applied to the control signal connection unit with the hold signal, generated by the switching device, by means of a gate unit in such a way that a modified control signal is obtained; and e) outputting of the modified control signal via an output connection unit, in order to activate circuit units to be controlled even in the event of a malfunction of one of more voltage generators of a generator unit.

The subclaims contain advantageous developments and improvements of the respective subject matter of the invention.

In accordance with one preferred development of the present invention, the control signal applied to the control signal connection unit is provided by a generator unit comprising voltage generators for supplying circuit units of the integrated module with supply voltages. In an advantageous manner, the control signal indicates whether or not a corresponding voltage of a voltage generator of a generator unit is present, whereas for operation of further circuit units to be controlled or for the testing of the circuit units to be controlled, this voltage is not required if the modified control signal is generated according to the invention.

In accordance with a further preferred development of the present invention, the activation signal is applied to the activation connection unit by means of a measuring tip encased in the activation unit, thereby achieving a simple switch-on of the modified control signal into a hold state.

In accordance with yet another preferred development of the present invention, the switching device assumes a permanent hold state in response to a change in a voltage level at its input, which hold state is advantageously reset only after a turn-off of all the supply voltages for the integrated circuit.

In accordance with yet another preferred development of the present invention, an OR combination of the control signal fed via the control signal connection unit with the hold signal generated by the switching device is performed in the gate unit in order to obtain the modified control signal in an advantageous manner by means of an OR function.

In accordance with yet another preferred development of the present invention, the modified control signal provided at the output connection of the gate unit is made available to further circuit units to be controlled, thereby advantageously enabling operation of the further circuit units to be controlled.

In accordance with yet another preferred development of the present invention, the activation unit applies a positive voltage pulse to the activation connection unit, thereby effecting setting of the switching device into a permanent hold state.

In accordance with yet another preferred development of the present invention, the activation unit applies a negative voltage pulse to the activation connection unit, thereby effecting resetting of the switching device from the permanent hold state into a basic state.

In accordance with yet another preferred development of the present invention, a ground potential is provided via the activation unit to the activation connection unit, thereby effecting resetting of the switching device from the permanent hold state into a basic state.

In accordance with yet another preferred development of the present invention, resetting of the switching device is effected by a switch-off of the entire signal generating device or of the entire integrated circuit.

In accordance with yet another preferred development of the present invention, the permanent hold state of the hold signal constitutes a logic one or "active high".

The invention's control signal generating device for providing a modified control signal furthermore has:

a) an activation connection unit for the application of an activation signal provided by an activation unit, for example a measuring tip;
b) a control signal connection unit for the application of a control signal which is provided by external circuit units;
c) a switching device for generating a hold signal in a manner dependent on the activation signal provided by the activation unit;
d) a gate unit for combining the control signal applied to the control signal connection unit with the hold signal generated by the switching device, in order to obtain a modified control signal; and
e) an output connection unit for outputting the modified control signal for further processing in circuit units to be controlled.

Exemplary embodiments of the invention are illustrated in the drawings and are explained in more detail in the description below.

BRIEF DESCRIPTION OF THE FIGURES

In the drawings.

In the figures, identical reference symbols designate identical or functionally identical components or steps.

DETAILED DESCRIPTION

Figure 1:
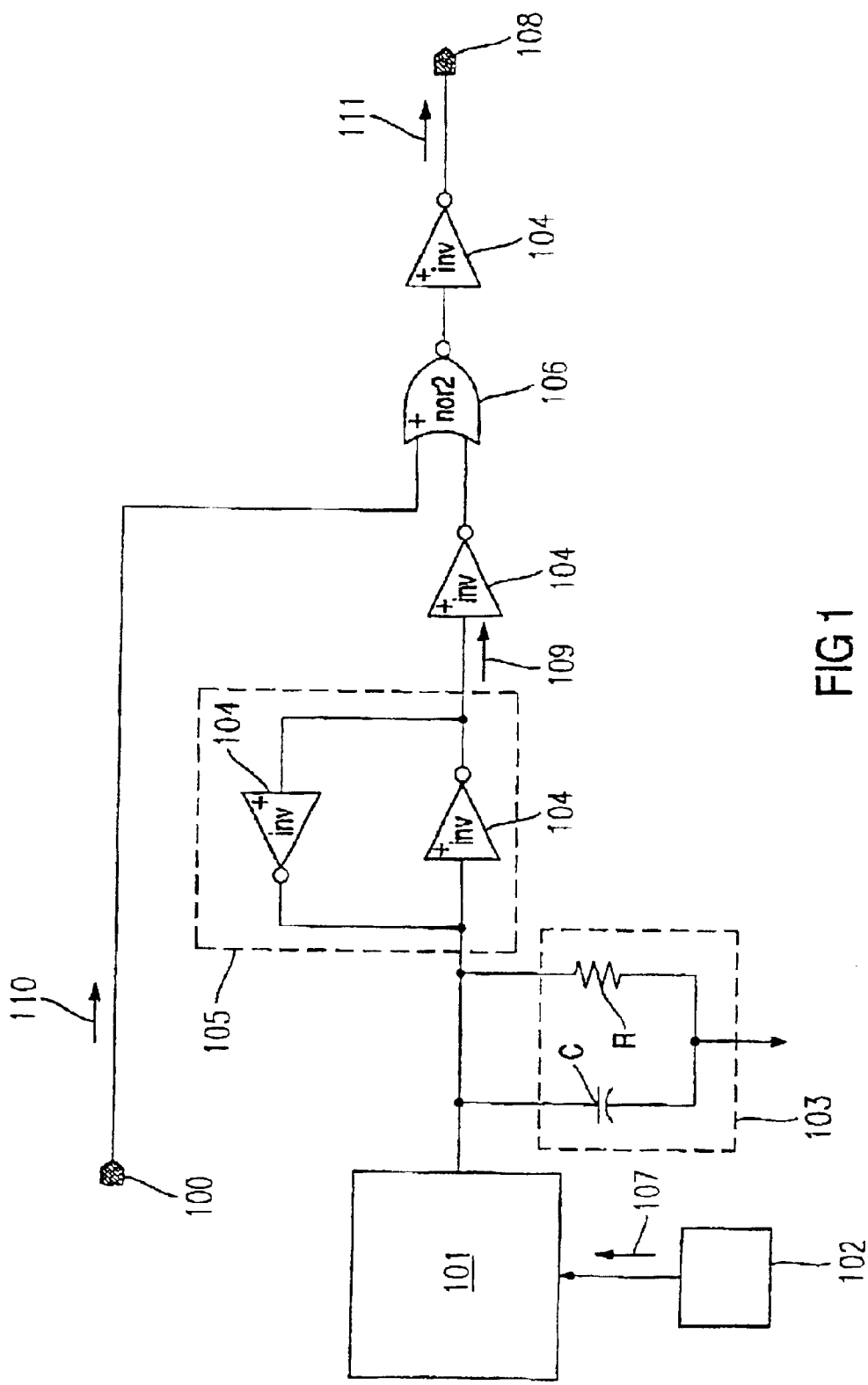
FIG. 1 shows a circuit arrangement for performing the invention's method for driving circuit units to be controlled in accordance with one exemplary embodiment of the present invention.
Figure 2:
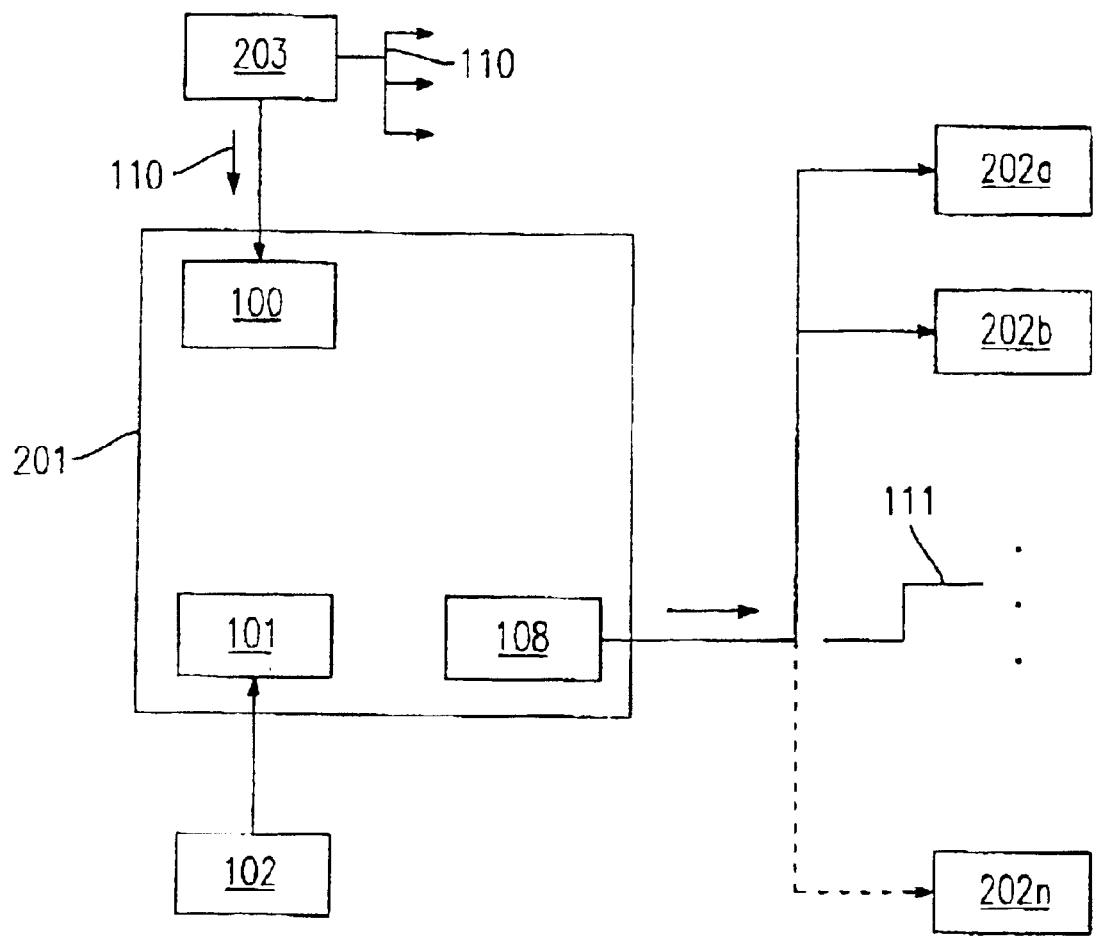
FIG. 2 shows a block diagram for illustrating how a control signal generating device in accordance with one exemplary embodiment of the present invention is introduced into a circuit environment with circuit units to be controlled and a generator unit.

FIG. 1 shows a preferred exemplary embodiment of the present invention as a circuit arrangement for carrying out a method for driving circuit units 202a–202n to be controlled, while FIG. 2 illustrates a block diagram of the circuit arrangement according to the invention.

As illustrated in FIG. 2, a generator unit 203 supplies one or more control signals 110, which are fed to a control signal connection unit 100 of a control signal generating device 201 according to the invention. Further essential components of the control signal generating device are an activation connection unit 101, which enables a modified control signal to be generated externally, and also an output connection unit 108, at which the modified control signal 111 is tapped off.

The generation of the modified control signal 111 is explained in detail below with reference to FIG. 1. The modified control signal 111 is furthermore provided to circuit units 202a–202b to be controlled, it advantageously not having to be ensured that the generator unit 203 supplies the specific control signal 110.

Rather, by means of an activation unit 102, activation of the control signal generating device 201 can be provided via an activation connection unit 101, so that a modified control signal 111 can undergo transition to a permanent hold state even without the presence of the control signal 110. This makes it possible, as already explained, for a modified control signal 111 to be provided for circuit units 202a–202b to be controlled even in the case of faulty voltage generators of a generator unit 203.

The control signal generating device 201 illustrated diagrammatically in the block diagram of FIG. 2 is shown in greater detail in FIG. 1. The latter shows the two input units, the control signal connection unit 100 for the inputting of the conventional control signal 110, and the activation connection unit 101 for the inputting of an externally predeterminable activation signal 107 via an activation unit 102. The activation unit 102 may be designed for example as a measuring tip which applies a specific voltage potential to the activation connection unit 101.

The modified control signal 111 is output via the output connection unit 108. The circuit arrangement according to the invention advantageously makes it possible for the conventional control signal 110 to be looped through the circuit arrangement according to the invention by the control signal 110 applied to the control signal connection unit 100 being fed to a first input of a gate unit 106, which is designed as a NOR gate in the preferred exemplary embodiment of the present invention. Inversion of the control signal 110 effected by the NOR gate is compensated for by an inverter unit 104 connected downstream, so that it is possible to tap off the original control signal 110 as part of the modified control signal 111 at the output connection unit 108.

According to the invention, a second signal is now fed to the second input connection of the NOR gate. This signal is designated as a hold signal 109 in FIG. 1, which can assume, in principle, two states, a basic state and a hold state, by virtue of a multivibrator arrangement provided from two inverter units. As illustrated in FIG. 1, a switching device 105 is formed from two inverter devices 104, the output of one inverter device in each case being connected to the input of the other inverter device. Such circuit arrangements are known by the name "latches".

If an activation signal 107 in the form of a positive voltage pulse, for example, is fed via the activation unit 102, then the switching device 105 switches in such a way that the hold signal 109 assumes a low level.

An inverter unit 104 connected downstream results in a signal with a high level being present at the second input of the gate unit 106. As described previously with reference to the control signal 110, a high input at the gate unit 106, which is designed as a NOR gate in this case, results in a signal with a low level being present at the output, which signal is subsequently inverted in a further inverter unit, so that a permanent high level is present as a modified control signal 111, (permanent hold state), which can be output via the output connection unit 108.

If a ground potential or a negative voltage level relative to ground is fed as an activation signal 107 to the activation connection unit 101 via the activation unit 102, then the switching device 105 switches the hold signal 109 from a low state to a high state, whereby the modified control signal 111 undergoes transition to a low state. Resetting of the switching device 105 is thus made possible.

It is thus possible, in an advantageous manner, to provide a modified control signal 111 in a permanent hold state even if no control signal 110 can be output by a generator unit 203 since, for example, one or more voltage generators of the generator unit 203 are faulty. In an advantageous manner, the switching device can be constructed as a bistable multivibrator, switching being effected between a hold state and a basic state.

Furthermore, it is expedient to provide a filter unit 103 between the activation connection unit 101 and an input of the switching device 105 in order to filter the activation signal 107. In particular, it is necessary here to attenuate high signal frequencies, low-pass filtering advantageously being provided. The filter unit 103 shown in FIG. 1 comprises a parallel circuit formed by a capacitor C0 and a resistor R2, whereby the filter unit 103 is designed as an RC low-pass filter.

Figure 3:
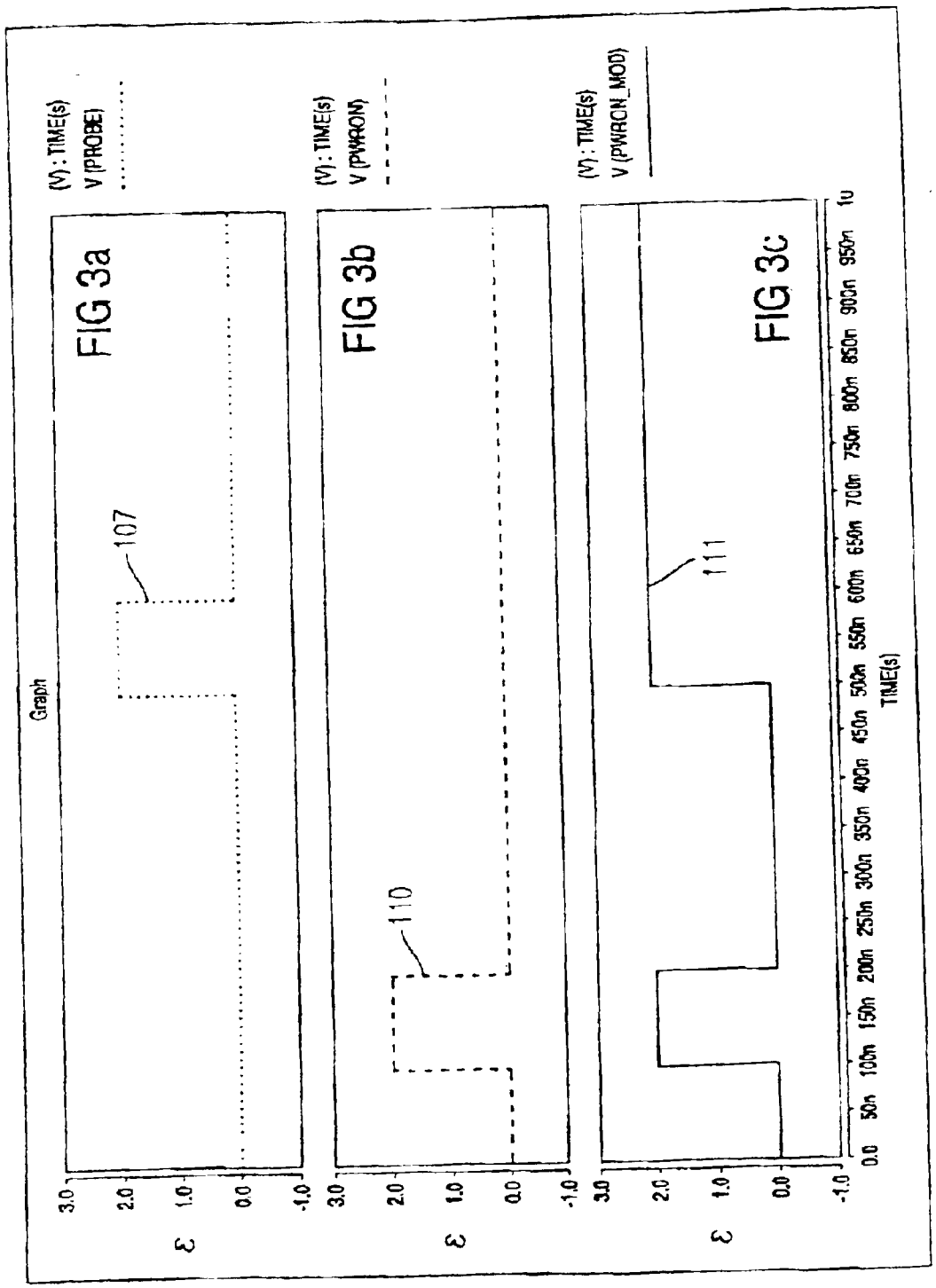
FIGS. 3(a)–(c) show diagrams demonstrating by way of example mutually assigned profiles of an activation signal (FIG. 3(a)), of a control signal (FIG. 3(b)) and of a modified control signal (FIG. 3(c))

Finally, FIG. 3 shows voltage profiles in accordance with one exemplary embodiment of the present invention. The illustration shows three voltage profiles over a time between 0.0 and 1 $\mu$s, voltage levels between 0 and 2 volts being plotted. Rectangular-waveform voltage profiles are shown as an example, but not as a restriction for the invention. FIG. 3($a$) shows the profile of an activation signal 107 which is fed to the activation connection unit 101.

FIG. 3($b$) shows a control signal 110 which is fed to the control signal connection unit 100.

FIG. 3($c$) shows a modified control signal 111 which, during operation of the circuit arrangement according to the invention as shown in FIG. 1, results from the two signals applied to the control signal generating device 201, the activation signal 107 and the control signal 110.

As already mentioned, the conventional control signal 110 is looped through from the control signal connection unit 100 to the output connection unit 108, so that the dashed signal profile of the control signal 110 as shown in FIG. 3($b$) can be found again in the modified control signal 111 of FIG. 3($c$). According to the invention, it is now possible, moreover, to apply an activation signal 107 to the activation connection unit 101, which is illustrated by the dotted signal profile in FIG. 3($a$).

In this case, after a fall in the activation signal 107, or after disconnection of a measuring tip contained in the activation unit 102, the modified control signal 111 does not fall to 0, but rather is available as a modified control signal in a permanent hold state. Thus, in an advantageous manner, circuit units 202$a$–202$b$ to be controlled (see FIG. 2) can be driven even if voltage generators in a generator unit have faults. The invention thus makes it possible to provide a permanent switch-on of an internal signal via an activation connection unit 101. An economic advantage is afforded by the fact that additional, cost-intensive production and characterization procedures are not necessary, since an integrated circuit remains testable even in the event of one or more faulty voltage generators of a generator unit.

Figure 4:
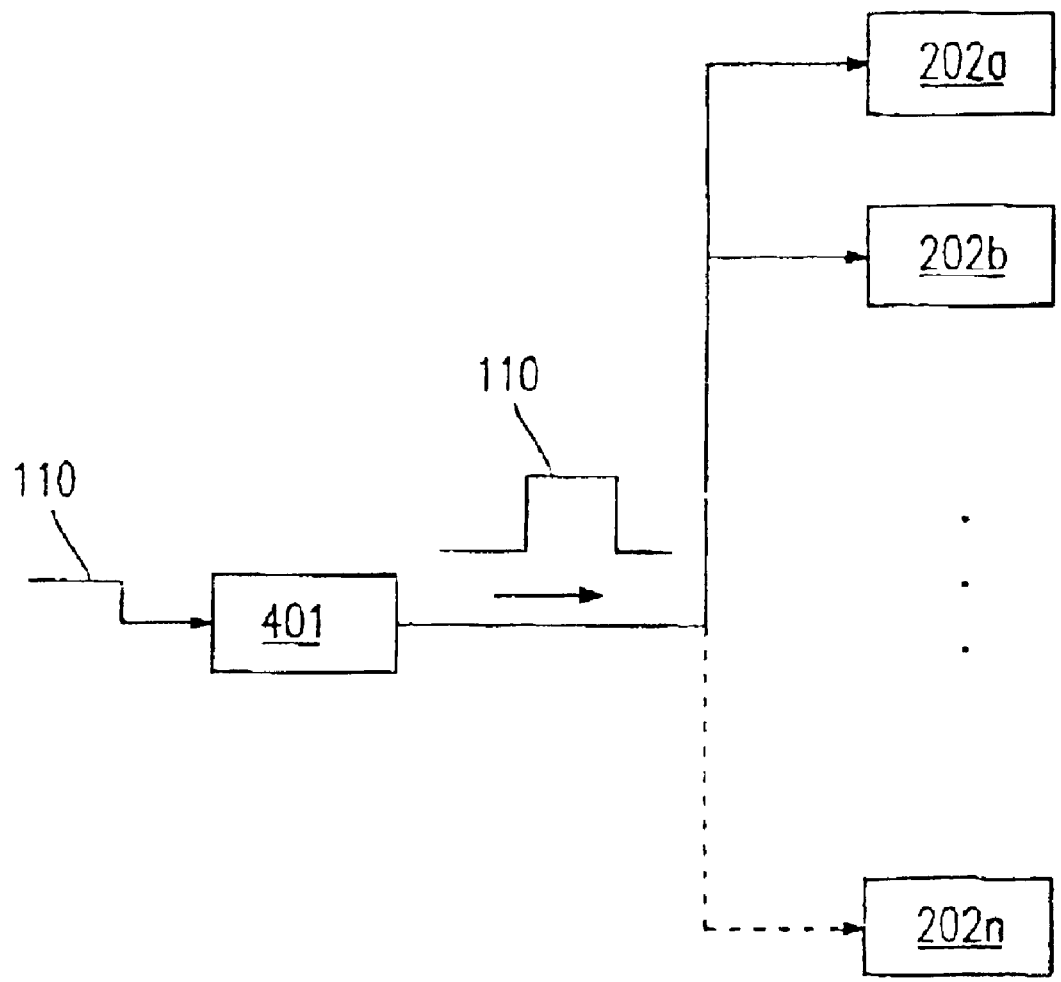
FIG. 4 shows a conventional circuit arrangement for distributing a control signal to circuit units to be controlled.

With regard to the conventional circuit arrangement—illustrated in FIG. 4—for driving circuit units to be controlled, reference is made to the introduction to the description.

Although the present invention has been described above using preferred exemplary embodiments, it is not restricted thereto, but rather can be modified in diverse ways.

What is claimed is:

1. A method for driving a plurality of circuit units to be controlled, the method comprising:

generating a plurality of supply voltages for the plurality of circuit units;

outputting a control signal when each of the supply voltages is set to a predetermined voltage;

applying the control signal to a control signal connection unit;

applying an activation signal to an activation connection unit;

generating a hold signal in response to the activation signal;

combining the control signal and the hold signal to obtain a modified control signal, the modified control signal being a NOR function of the control signal and the hold signal; and outputting the modified control signal.

2. The method of claim 1, wherein applying an activation signal comprises providing an activation unit for supplying the activation signal.

3. The method of claim 1, wherein generating a hold signal comprises providing a switching device for generating a hold signal in response to an activation signal provided by an activation unit.

4. The method of claim 1, wherein combining the control signal and the hold signal comprises providing a gate unit for receiving the control signal and the hold signal.

5. The method of claim 1, wherein outputting the modified control signal comprises providing an output connection unit.

6. The method of claim 1, further comprising providing a generator unit to generate the control signal.

7. The method of claim 1, wherein applying an activation signal comprises providing an activation unit having a measuring tip encased therein for providing the activation signal.

8. The method of claim 1, wherein generating a hold signal comprises detecting a change in an input voltage level, and in response to the change, assuming a permanent hold state.

9. The method of claim 3, further comprising configuring the switching device to assume a permanent hold state in response to a change in an input voltage level at an input thereof.

10. The method of claim 1, wherein combining the control signal and the hold signal to obtain a modified control signal comprises generating a modified control signal on the basis of a logical value derived from a logical OR of the control signal and the hold signal.

11. The method of claim 1, wherein outputting the modified control signal comprises providing the modified control signal to each of the circuit units to be controlled.

12. The method of claim 1, wherein generating a hold signal comprises setting a permanent hold state in response to a voltage pulse having a first selected polarity.

13. The method of claim 1, wherein generating a hold signal comprises resetting a permanent hold state in response to a voltage pulse having a second selected polarity, the second selected polarity being opposite to a first selected polarity for setting a permanent hold state.

14. The method of claim 1, wherein generating a hold signal comprises resetting a permanent hold state in response to a ground potential.

15. The method of claim 1, wherein generating a hold signal comprises resetting a permanent hold state in response to loss of the activation signal.

16. The method of claim 1, wherein generating a hold signal comprises providing a selected logical value indicative of a permanent hold state.

17. A control signal generating device for providing a modified control signal, the control signal generating device comprising:
- a generator unit for generating a plurality of supply voltages for a plurality of circuit units to be controlled, the generator unit beams configured to output a control signal when each of the supply voltages is set to a predetermined supply voltage;
- an activation connection unit for applying an activation signal provided by an activation unit;
- a switching device for generating a hold signal in response to the activation signal;
- a gate unit for generating a modified control signal on the basis of the control signal and the hold signal, the sate unit being configured to provide, as the modified control signal, a NOR function of the control signal and the hold signal; and
- an output connection unit for outputting the modified control signal.

18. The control signal generating device of claim 17, wherein the gate unit comprises an OR gate.

19. The control signal generating device of claim 17, wherein the gate unit comprises a NOR gate.

20. The control signal generating device of claim 17, wherein the switching device comprises a multivibrator.

21. The control signal generating device of claim 20, wherein the multivibrator comprises two inverter units coupled back to back.

22. The control signal generating device of claim 17, wherein the switching device comprises a bistable multivibrator.

23. The control signal generating device of claim 17, further comprising a filter unit for filtering the activation signal, the filter unit being electrically disposed between the activation connection unit and an input of the switching device.

24. The control signal generating device of claim 23, wherein the filter comprises an RC low-pass filter.

* * * * *